United States Patent

Tokunaga et al.

[11] Patent Number: 5,718,761
[45] Date of Patent: Feb. 17, 1998

[54] METHOD OF FORMING CRYSTALLINE COMPOUND SEMICONDUCTOR FILM

[75] Inventors: Hiroyuki Tokunaga, Kawasaki; Jun-ichi Hanna; Isamu Shimizu, both of Yokohama, all of Japan

[73] Assignee: Canon Kabushiki Kaisha, Tokyo, Japan

[21] Appl. No.: 635,214

[22] Filed: Apr. 17, 1996

Related U.S. Application Data

[63] Continuation of Ser. No. 137,488, Oct. 18, 1993, abandoned, which is a continuation of Ser. No. 870,115, Apr. 17, 1992, abandoned, which is a continuation of Ser. No. 689,105, Apr. 23, 1991, abandoned, which is a continuation of Ser. No. 234,748, Aug. 22, 1988, abandoned.

[30] Foreign Application Priority Data

Aug. 24, 1987 [JP] Japan ................. 62-209455

[51] Int. Cl.⁶ ................................. C03B 25/04
[52] U.S. Cl. ................. 117/94; 117/95; 117/97; 117/101; 117/104; 117/913; 117/923; 437/81
[58] Field of Search ................. 117/913, 923, 117/94, 95, 97, 101, 104; 427/255.1; 437/81

[56] References Cited

U.S. PATENT DOCUMENTS

| | | | |
|---|---|---|---|
| 3,620,833 | 11/1971 | Gleim et al. | 437/62 |
| 4,141,778 | 2/1979 | Domrachev et al. | 156/613 |
| 4,216,036 | 8/1980 | Tsang | 148/175 |
| 4,422,888 | 12/1983 | Stutius | 156/606 |
| 4,566,918 | 1/1986 | Irvine et al. | 156/613 |
| 4,568,397 | 2/1986 | Hoke et al. | 156/DIG. 72 |
| 4,599,150 | 7/1986 | Mullin et al. | 204/59 QM |
| 4,632,711 | 12/1986 | Fujita et al. | 156/610 |
| 4,650,539 | 3/1987 | Irvine et al. | 156/DIG. 72 |
| 4,720,560 | 1/1988 | Hui et al. | 556/1 |

FOREIGN PATENT DOCUMENTS 60-215596  10/1985  Japan ................. 156/613

OTHER PUBLICATIONS

Jastrezbski, "SCI By CVD: Epitaxial Lateral Overgrowth (ELC) Process Review" Journal of Crystal Growth, vol. 63 (1983) pp. 493–526.

Kisker et al. "Low–Temperature Organometallic Vapor Phase Epitaxial Growth of CDTE . . . ", Applied Physics Letters, vol. 50(23) Jun. 8, 1987, pp. 1681–1683.

Claussen et al, "The Nucleation of CVD Silicon on $SiO_2$ and $Si_3N_4$ Substrates" J. Electrochemical Society; Solid State Science and Technology, Jan. 1980 pp. 194–202.

Bloem et al., "Nucleation and Growth of Silicon Films By Chemical Vapour Deposition," Philips Technical Review, vol. 41, 1983/84.

P. Rai–Choudhury et al, *Selective Growth of Epitaxial Silicon and Galliuim Arsenide*, J. Electrochem. Soc.: Solid State Science, vol. 118, No. 1, pp. 107–110, Jan. 1971.

*Primary Examiner*—Robert Kunemund
*Attorney, Agent, or Firm*—Fitzpatrick, Cella, Harper & Scinto

[57] ABSTRACT

A method of forming a crystalline compound semiconductor film comprises introducing into a crystal forming space housing a substrate on which a non-nucleation surface ($S_{NDS}$) having a smaller nucleation density and a nucleation surface ($S_{NDL}$) having a fine surface area sufficient for crystal growth only from a single nucleus and having a larger nucleation density ($ND_L$) than the nucleation density (NDs) of the non-nucleation surface ($S_{NDS}$) are arranged adjacent to each other an organometallic compound (VI) for supplying an element belonging to the group VI of Periodic Table represented by the general formula $R_1-X_n-R_2$ wherein n is an integer of 2 or more; $R_1$ and $R_2$ each represent alkyl; and X is S, Se or Te and a compound (II) for supplying an element belonging to the group II of Periodic Table in gas phase and applying crystal growth treatment according to the vapor phase method to the substrate to selectively form a crystalline group II–VI compound semiconductor film on the substrate.

4 Claims, 5 Drawing Sheets

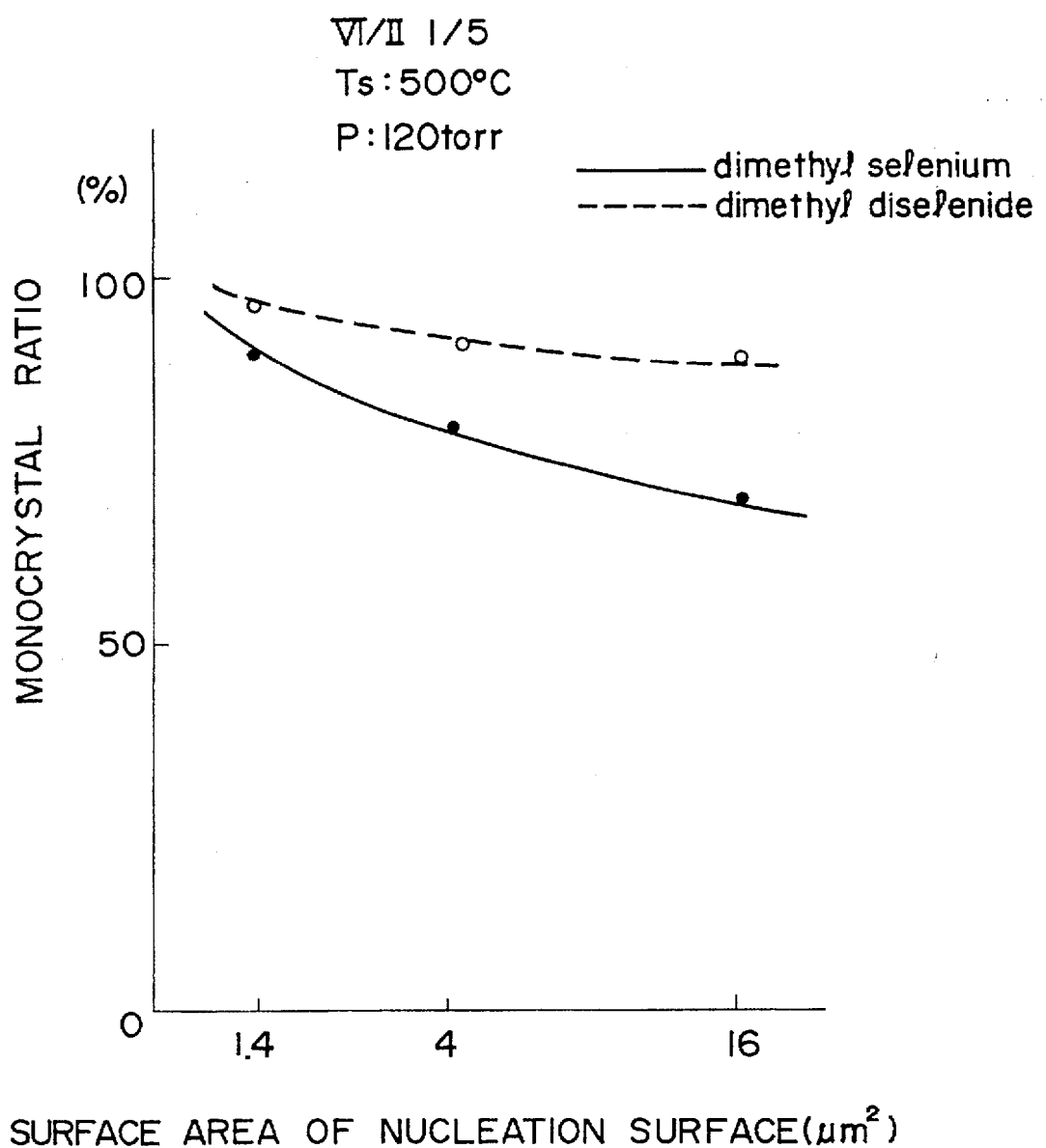

1

METHOD OF FORMING CRYSTALLINE COMPOUND SEMICONDUCTOR FILM

This is a continuation of application Ser. No. 08/137,488 filed Oct. 18, 1993, now abandoned, which is a continuation of application Ser. No. 07/870,115 filed Apr. 17, 1992, now abandoned, which is a continuation of application Ser. No. 07/689,105 filed Apr. 23, 1991, now abandoned, which is a continuation of application Ser. No. 07/234,748 filed Aug. 22, 1988, which is now abandoned.

BACKGROUND OF THE INVENTION

1. Field of the Invention

This invention relates to a method of forming a compound semiconductor by use of an organometallic compound starting material.

2. Related Background Art

For preparation of a group II–VI compound thin film according to the MOCVD (Metal organic compound chemical vapor deposition), method of the prior art, a hydride of the group VI element or an alkylated product in the form of $R_1$—X—$R_2$ (X is selected from S, Se and Te), and $R_1$ and $R_2$ each represent alkyl) has been used as the group VI element supplying starting material (hereinafter abbreviated as group VI starting material). The method has involved the following problems.

A hydride of the group VI element had too high reactivity with the group II element supplying starting material (hereinafter abbreviated as group II starting material), whereby the reaction in the gas phase cannot be controlled, and therefore crystallinity of the epitaxial film was worsened, or it was difficult to control growth of a thin film.

On the other hand, the alkylated product in the form of $R_1$—X—$R_2$, which is slightly lower in reactivity with the group II starting material, can be more readily controlled in growth than the hydride, by utilizing higher substrate temperature.

Accordingly, in the case where the above hydride or alkylated product was used as the starting material according to the MOCVD method to selectively form a film on a patterned substrate, formation of a film on the mask surface (non film-forming surface), could not be sufficiently inhibited.

Further, the alkylated product in the form of $R_1$—X—$R_2$ also had problems such as high toxicity and explosiveness.

SUMMARY OF THE INVENTION

The primary object of the present invention is to provide a method of forming a crystalline film of a compound semiconductor of high quality which improves growth controllability of a thin film by solving the problems of the prior art as described above.

Another object of the present invention is to provide a method of forming a compound semiconductor thin film of a group II–VI compound on a desired substrate according to the MOCVD method, which comprises using an alkylated product in the form of $R_1$—$X_n$—$R_2$ (n is an integer of 2 or more, $R_1$ and $R_2$ each represent alkyl and X represents S, Se or Te) as the organometallic starting material of the group VI.

Still another object of the present invention is to provide a method of forming a compound semiconductor thin film using a starting gas $R_1$—$X_n$—$R_2$ which is by far safer with respect to toxicity and explosiveness as compared with the prior art starting gas in the form of $R_1$—X—$R_2$.

Yet another object of the present invention is to provide a method of forming a compound semiconductor thin film in which the reactivity with the group II gas is moderate and by which uniformity over a large area can be improved.

Yet still another object of the present invention is to provide a method of forming a compound semiconductor thin film by which the monocrystal ratio can be dramatically improved in crystal formation utilizing selective nucleation.

BRIEF DESCRIPTION OF THE DRAWINGS

FIG. 3 is a graph showing the relationship between the group VI starting material and the monocrystal ratio and FIGS. 4a to 4d are diagrams of the steps of the method of forming a crystal of a compound semiconductor utilizing the selective nucleation method.

DESCRIPTION OF THE PREFERRED EMBODIMENTS

Figure 1:
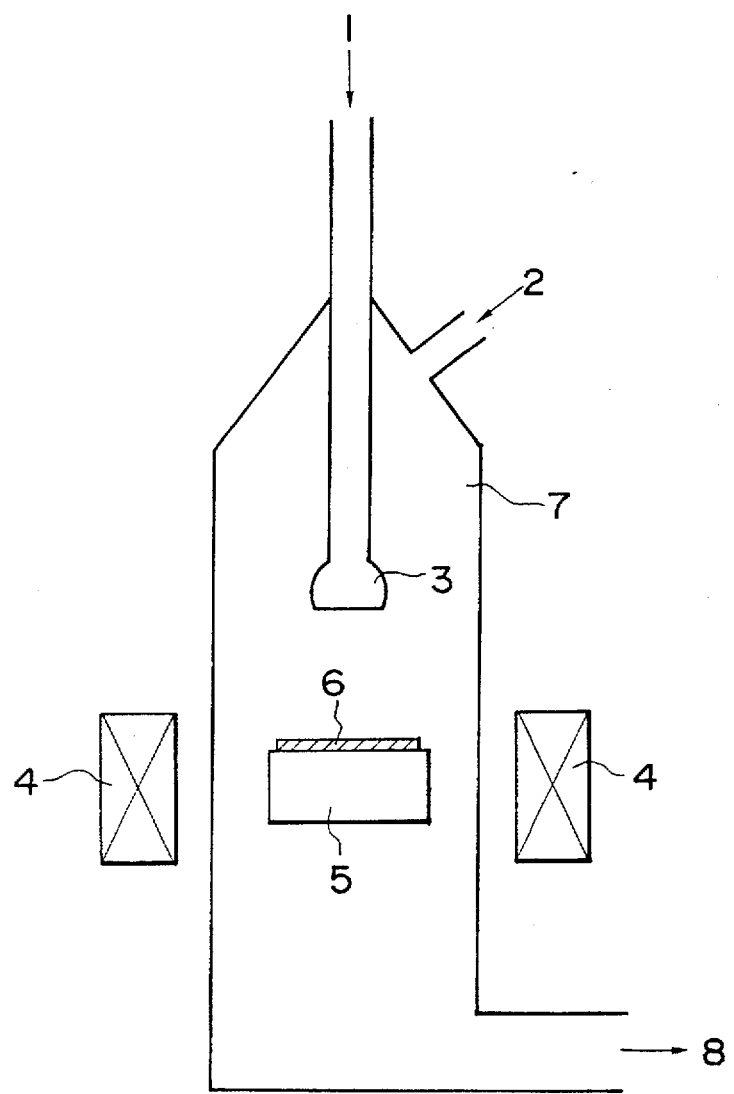
FIG. 1 is a MOCVD device.

FIG. 1 is a schematic illustration of one of the preferred embodiments of a device for embodying the method for forming a compound semiconductor film of the present invention.

A group II starting material from an introducing inlet 1 and a group VI starting material from an introducing inlet 2 are fed into quartz chamber 7. The starting material gases are mixed near the blowing outlet 3 to form a stable intermediate through chemical reaction, which is then delivered to the surface of the substrate 6.

The substrate 6 is held by a substrate holder 5 heated by a high frequency coil 4. The intermediate is thermally decomposed on the substrate 6 to deposit a compound semiconductor film. The remaining gas is evacuated through a vacuum pump 8.

The present invention applies the selective crystal growth method to the above mentioned MOCVD method. First, for better understanding of the present invention, the outline of the selective crystal growth method is to be described.

The selective crystal growth method is a method, in which a monocrystal is permitted to grow originating from a single nucleus formed on a nucleation surface provided on a non-nucleation surface (namely the surface with smaller nucleation density) which has sufficiently larger nucleation density than the non-nucleation surface and a fine surface area to the extent that only a single nucleaus can be generated. Thus, in this method, growth of crystal on the non-nucleation surface, is depressed and growth of a monocrystal occurs only on the nucleation surface.

FIG. 2 is a diagram of steps showing an example of the steps of the method of forming a crystal of a compound semiconductor according to the selective nucleation method of the present invention.

First, on a substrate 9 comprising high melting glass, quartz, alumina, ceramic, etc. which can stand high temperature, a $SiO_2$ film 10 is deposited to about 1000 Å according to the conventional chemical vapor deposition method (CVD method) by use of, for example, silane ($SiH_4$) and oxygen ($O_2$) [Formation of Substrate]. Nucleation density (NDs) of the group II–VI compound semiconductor on $SiO_2$ film 10 is small, and the $SiO_2$ film 10 provides the non-nucleation surface ($S_{NDS}$). The above non-nucleation surface ($S_{NDS}$) may be formed by the physical vapor deposition (PVD) method such as vapor deposition method, sputtering method, etc.

In the case where the surface of the substrate 9 is constituted of material providing a non-nucleation surface ($S_{NDS}$), it is possible to use only the substrate 9 as it is without providing a $SiO_2$ film, etc. thereon.

Next, the surface of the $SiO_2$ film 10 is masked to a desired pattern with a photoresist 11.

Ions 12 of an element selected from among the group IV, the group II, and the group VI elements are implanted by use of an ion implanter.

Figure 2A:
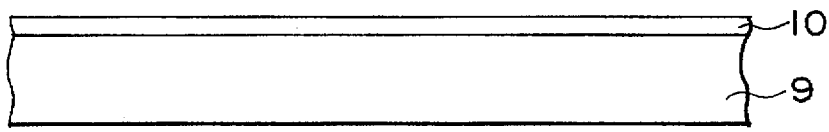
FIGS. 2a–2g are diagrams of the steps of the method of forming a compound semiconductor crystal utilizing the selective nucleation method.
Figure 2B:
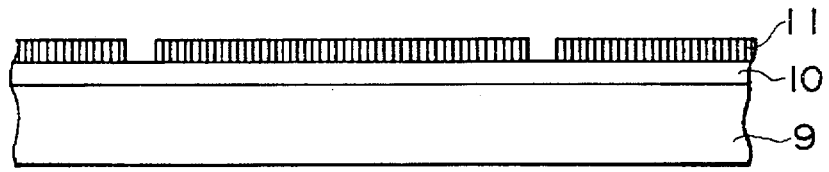
Figure 2C:
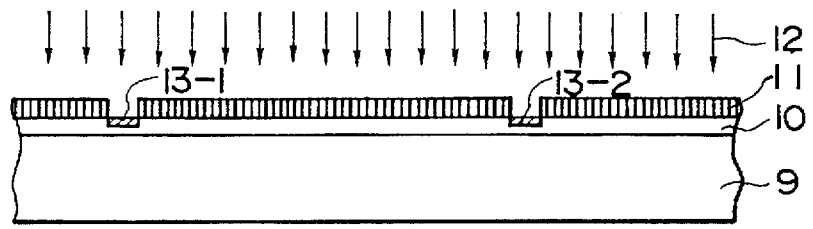
Figure 2D:
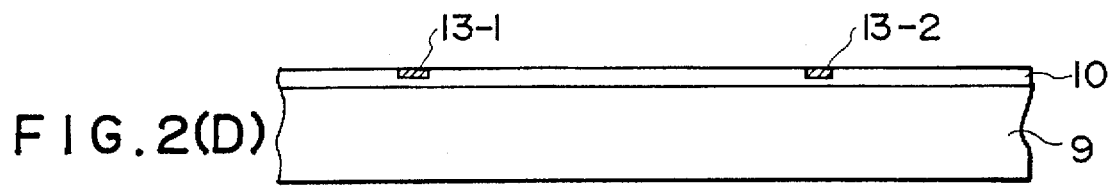

The ions 12 are implanted onto the exposed $SiO_2$ film surface (FIGS. 2(C) and 2(D)). The amount of ions implanted may be determined depending on the desired characteristics, but should be preferably $1 \times 10^{15}$ cm$^{-2}$ or more, more preferably $5 \times 10^{15}$ cm$^{-2}$ or more, and most preferably $1 \times 10^{16} - 2 \times 10^{16}$ cm$^{-2}$. Preferred elements implanted as ions 12 include Si, Ge, Zn, Cd, S and Se. Nucleation density (NDs) of the group II-VI compound semiconductor on the surface where no ion is implanted is small, and this portion becomes the non-nucleation surface ($S_{NDS}$). On the other hand, the regions 13-1, 13-2 where ions are implanted have larger nucleation density ($ND_L$) than the non-nucleation surface ($S_{NDS}$), and this portion becomes the nucleation surface ($S_{NDL}$). At this time, the size of the ion implanted portion is generally some μm or less, preferably 2 μm or less, and most preferably 1 μm or less.

After the photoresist 11 is removed and the substrate (the support 9 provided with the $SiO_2$ film 10 on the surface thereof) is washed, an organometallic material represented by the general formula $R_1—X_n—R_2$, which is the group VI element supplying starting material, is supplied to form a compound semiconductor material film on a substrate. In the present application, the organometallic compound represented by the general formula $R_1—X_n—R_2$ as the group VI element supplying starting material may be suitably selected depending on the desired characteristics, but should be preferably the compounds wherein n is 2–4 and $R_1$ and $R_2$ each represent methyl or ethyl. Preferred organometallic compounds (VI) represented by the general formula $R_1—X_n—R_2$ include the following:

dimethyl disulfide $CH_3—S—S—CH_3$ diethyl disulfide $C_2H_5—S—S—C_2H_5$ dimethyl trisulfide $CH_3—S—S—S—CH_3$ diethyl trisulfide $C_2H_5—S—S—S—C_2H_5$ dimethyl diselenide $CH_3—Se—Se—CH_3$ diethyl diselenide $C_2H_5—Se—Se—C_2H_5$ dimethyl triselenide $CH_3—Se—Se—Se—CH_3$ diethyl triselenide $C_2H_5—Se—Se—Se—C_2H_5$ t-butylethyl disulfide $t-C_4H_9—S—S—C_2H_5$ dipropyl disulfide $C_3H_7—S—S—C_3H_7$ dimethyl ditelluride $CH_3—Te—Te—CH_3$ diethyl ditelluride $C_2H_5—Te—Te—C_2H_5$ Preferred examples of the compound (II) which is the group (II) atoms supplying starting material include organometallic compounds such as dimethylzinc [$Zn(CH_3)_2$] diethylzinc [$Zn(C_2H_2)_2$], dimethylcadium [$Cd(CH_3)_2$], diethylcadmium [$Cd(C_2H_5)_2$], etc.

The film forming conditions in the method of forming a group II-VI compound semiconductor film of the present invention may be suitably determined. However, the substrate temperature should preferably be 300°–600° C., more preferably 300°–550° C., and most preferably 400°–500° C., and the reaction pressure should be preferably 1–400 torr, more preferably 10–300 torr, and most preferably 50–100 torr. Especially, when a ZnSe compound semiconductor film is formed, a reaction pressure within the range of 10–300 torr is preferred.

FIG. 3 is a graph showing the relationship between the monocrystal ratio (number of monocrystalline islands/(number of monocrystalline islands+number of polycrystalline islands)) and the surface area of nucleation surface when dimethylzinc $(CH_3)_2Zn$ is used as Zn supplying starting material and dimethyl selenide $(CH_3)_2Se$ [Reference Example] or dimethyl diselenide $(CH_3)_2Se_2$ [Example of Present Invention] is used as Se supplying material. As shown in FIG. 3, when dimethyl selenium is used, the monocrystal ratio will be remarkably lowered as the nucleation surface becomes larger. Here, the word "polycrystal" is intended to mean the crystal grown until two or more monocrystals are contacted with grain boundaries formed therebetween.

More specifically, in judging whether the obtained crystal is polycrystalline or not, those crystals through which two or more grain boundaries run when observed through the upper surface of the crystal by a SEM are defined as polycrystals.

In the above example and reference example, the crystal forming time was 30 minutes; the nucleation surface distance was 100 μm; the molar ratio (VI/II) of the group VI element supplying starting material and the group II element supplying starting material was 1:5; the substrate temperature was 500° C.; and the inner pressure was 120 Torr.

As can be seen in FIG. 3, the monocrystal ratio is higher when dimethyl diselenide is used as the group VI element supplying starting material (present invention).

The present invention is further illustrated by the following examples but it is to be understood that the scope of the invention is not to be limited thereby.

EXAMPLE 1

Crystal forming treatment was carried out by the apparatus shown in FIG. 1 in accordance with the steps as shown in FIG. 2. In the surface of a support 9 constituted of quartz, a $SiO_2$ film 10 was deposited to a film thickness of 1000 Å under the following conditions:

Flow rate ratio of starting gases (molar ratio): $SiH_4:O_2=$ 3:1.7

Pressure: 1 atm

Support temperature: 400° C.

Next, on the surface of the $SiO_2$ film 10 was provided a photoresist (trade name OSTR-800, manufactured by Tokyo Ohka.) Following the conventional method and procedure, the photoresist 11 was subjected to patterning treatment to provide 20×20 holes of 1 μm square with an interval of 50 μm. Next, by use of an ion implanter (trade name: CS 3000, manufactured by VARIAN Corp.), $Se^{2-}$ ions of $1 \times 10^{15}$ cm$^{-2}$ were implanted to form the regions 13-1 and 13-2 [see FIG. 2(C)].

After the photoresist 11 remaining on the $SiO_2$ film 10 was peeled off, the support was subjected to heat treatment in $PCl_3$ atmosphere at about 550° C. for 10 minutes to clean the surface of the $SiO_2$ film 10.

Subsequently, while the support was heated to 500° C., dimethylzinc $(CH_3)_2Zn$ together with dimethyl diselenide $(H_3C—Se—Se—CH_3)$, and further HCl were flowed onto the support surface at a molar ratio of 1:8:0.2 together with a carrier gas $H_2$, thereby permitting ZnSe monocrystals to grow [FIGS. 2(E) and 2(F)]. The reaction pressure at this time was made 100 Torr.

The chemical reaction at the time of formation of ZnSe crystal in the present invention is hypothesized as follows. That is, the starting gases are mixed near the blowing outlet 3 shown in FIG. 1 to cause chemical reaction, thereby forming a stable intermediate as shown below, which is then delivered to the surface of the SiO$_2$ film 10 on the support to be thermally decomposed.

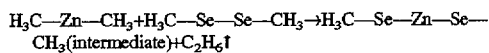

Figure 2E:
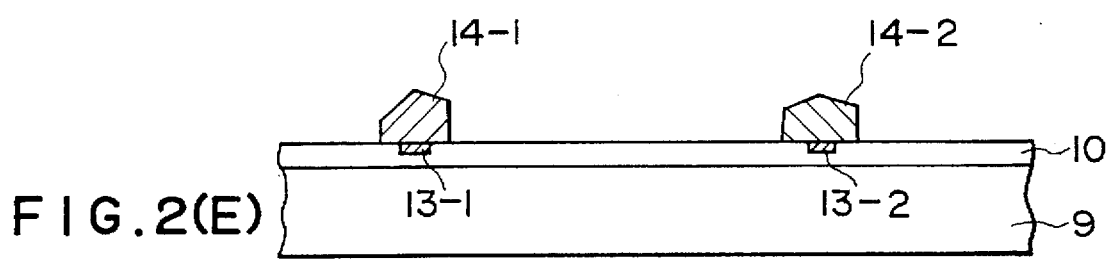

At that time, as shown in FIG. 2(E), ZnSe monocrystals 14-1, 14-2 grow only on the nucleation surface 13-1, 13-2 where Se$^{2-}$ ions have been implanted, and no ZnSe crystal is formed on the SiO$_2$ film surface where no Se$^{2-}$ ion has been implanted.

Figure 2F:
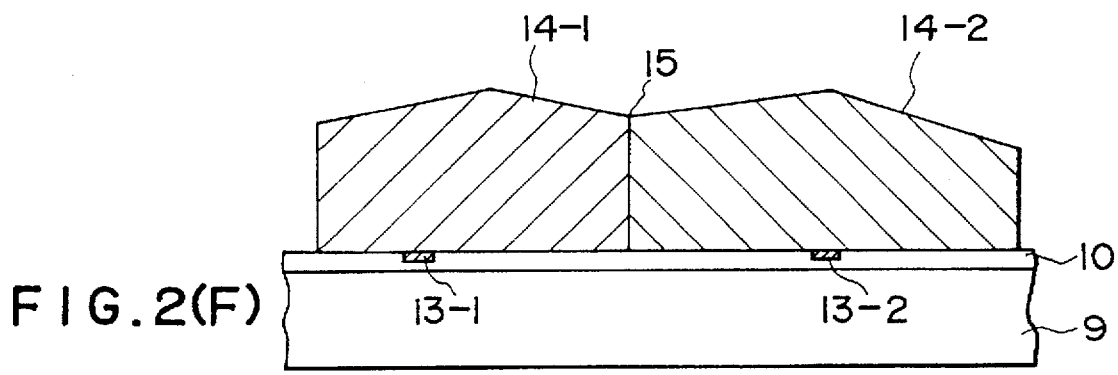
Figure 2G:
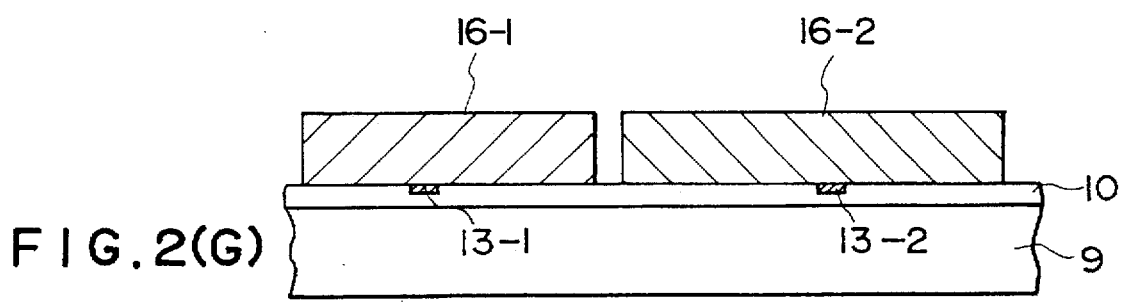

When growth of the ZnSe monocrystal 14-1, 14-2, is further continued, ZnSe crystals 14-1 and 14-2 come into contact with each other as shown in FIG. 2(F). At that stage, the crystal growth treatment was stopped and the surface portions of the ZnSe monocrystals 14-1, 14-2 were polished and the portions of the crystal grain boundary 15 was etched (FIG. 2(G)). Thus ZnSe monocrystals 16-1, 16-2 were obtained.

EXAMPLE 2

Crystal growth treatment was carried out by use of the apparatus schematically shown in FIG. 1 in accordance with the steps shown in FIGS. 4(A)–4(D) which show the ZnS crystal forming steps.

Figure 4A:
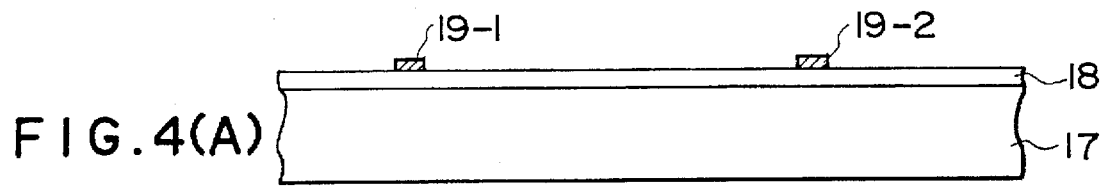
Figure 4B:
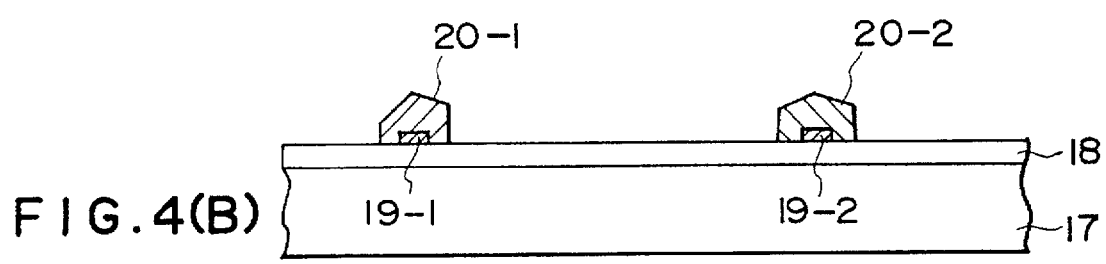

First, on an alumina support 17, a SiO$_2$ film 18 was deposited to a thickness of 2000 Å similarly as in Example 1 by use of SiH$_4$ and O$_2$ as the starting materials by the thermal CVD method. Next, according to the plasma CVD method using SiH$_4$ and NH$_3$ as the starting gases, a SiN$_x$ film was deposited to a thickness of 300 Å on the SiO$_2$ film 18. The supplying ratio of SiH$_4$ and NH$_3$ was 2:1; the reaction pressure was 0.15 Torr; and the high frequency output power was $1.6 \times 10^{-2}$ W/cm$^2$. The SiN$_x$ film was then subjected to patterning treatment to form 20×20 nucleation surfaces 19-1, 19-2 having a surface area of 1 μm square (See FIG. 4(A)) [Formation of substrate to be subjected to crystal forming treatment]. After the substrate was well washed, it was subjected to heat treatment in H$_2$ atmosphere at about 900° C. for 10 minutes. Next, while heating the substrate to 550° C., dimethylzinc (H$_3$C—Zn—CH$_3$) and dimethyl disulfide (H$_3$C—S—S—CH$_3$) were supplied at a molar ratio of 1:20 together with carrier gas H$_2$ to permit ZnS monocrystals 20-1, 20-2 to grow. The reaction pressure at this time was 150 Torr. As shown in FIG. 4(B), ZnS crystals 20-1, 20-2 were grown only from the nucleation srufaces of a SiN$_x$ film 19-1, 19-2, while no ZnS nucleus was generated on the SiO$_2$ surface as the non-nucleation surface.

Figure 4C:
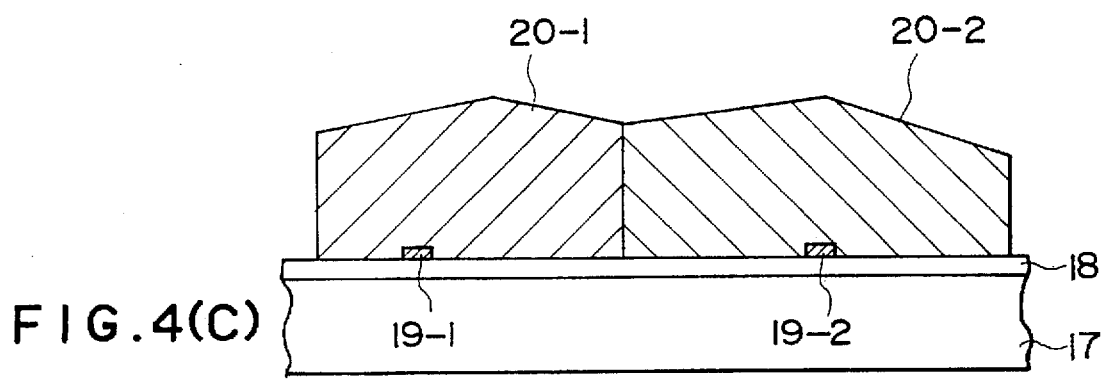
Figure 4D:
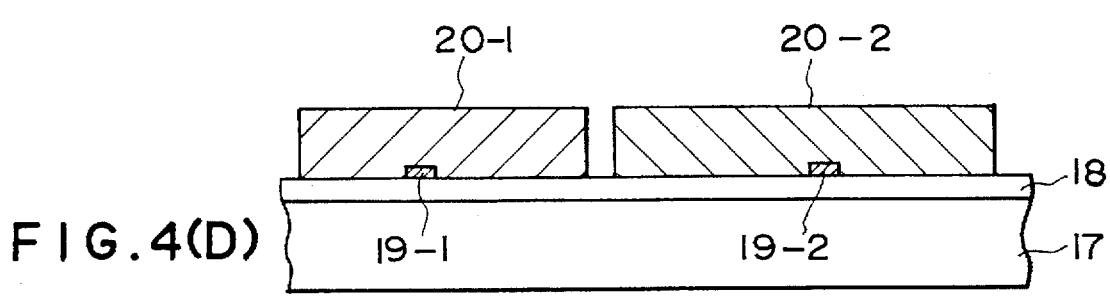

When the ZnS monocrystals 20-1, 20-2 were further permitted to grow, ZnS monocrystals 20-1 and 20-2 came into contact with each other as shown in FIG. 4(C). At that stage, the crystal forming treatment was stopped. The surface portions of the ZnS monocrystals 20-1, 20-2 were then polished and the crystal grain boundary 15 was removed by etching to obtain ZnS monocrystals 20-1, 20-2 as shown in FIG. 4(D). The ZnS monocrystals 20-1, 20-2 thus obtained were confirmed to have very good crystallinity and to be execellent in semiconductor characteristics.

We claim:

1. A method of forming a crystalline semiconductor film including a group II element and a group VI element in a crystal forming space housing a substrate, comprising the steps of:

(a) providing said substrate having a non-nucleation surface and an adjacent nucleation surface, wherein said nucleation surface is formed by ion-implanting the non-nucleation surface in an amount of $1 \times 10^{15}$ cm$^{-2}$ or more ions, said nucleation surface comprising an amorphous material and having a surface area up to about 16 μm$^2$ so as to permit only a single nucleus to grow and having a larger nucleation density than the nucleation density of the non-nucleation surface;

(b) introducing into a mixing space (i) a gaseous organometallic compound for supplying an element belonging to group VI of the Periodic Table, said organometallic compound being represented by the formula R$_1$—X$_n$—R$_2$ wherein n is an integer of 2 or more; R$_1$ and R$_2$ represent alkyl; and X is S, Se, or Te; and (ii) a gaseous compound for supplying an element belonging to group II of the Periodic Table;

(c) mixing and reacting said gaseous organometallic compound and said gaseous compound in order to form a stable intermediate;

(d) forming said single nucleus on said nucleation surface of said substrate with said stable intermediate; and (e) growing said crystalline film on said substrate by gaseous metal organic compound chemical vapor deposition.

2. The method according to claim 1, wherein the gaseous compound for supplying an element belonging to group II of the Periodic Table is an organometallic compound.

3. The process according to claim 1, wherein the nucleation surface is less than about 2 microns.

4. The process according to claim 2, wherein the nucleation surface is less than about 2 microns.

* * * * *

UNITED STATES PATENT AND TRADEMARK OFFICE
CERTIFICATE OF CORRECTION

PATENT NO. : 5,718,761

DATED : February 17, 1998

INVENTOR(S) : HIROYUKI TOKUNAGA ET AL.  Page 1 of 2

It is certified that error appears in the above-identified patent and that said Letters Patent is hereby corrected as shown below:

Title page, item
[56] REFERENCES CITED

Other Publications
   "Galliuim" should read --Gallium--.

COLUMN 2

Line 41, "method," should read --method--.

Line 49, "surface," should read --surface--.

Line 61, "[Formation" should read --¶ [Formation--.

COLUMN 3

Line 58, "dimethylcadium" should read
     --dimethylcadmium--.

COLUMN 5

Line 19, "Was" should read --were--.

Line 50, "srufaces" should read --surfaces--.

UNITED STATES PATENT AND TRADEMARK OFFICE
CERTIFICATE OF CORRECTION

PATENT NO. : 5,718,761

DATED : February 17, 1998

INVENTOR(S) : HIROYUKI TOKUNAGA ET AL.

Page 2 of 2

It is certified that error appears in the above-identified patent and that said Letters Patent is hereby corrected as shown below:

<u>COLUMN 6</u>

Line 10, "execellent" should read --excellent--.

Signed and Sealed this

Twenty-eighth Day of July, 1998

Attest:

BRUCE LEHMAN

Attesting Officer

Commissioner of Patents and Trademarks